(12) United States Patent
Bae et al.

(10) Patent No.: US 8,667,364 B2
(45) Date of Patent: Mar. 4, 2014

(54) AUTOMATIC DATA RECOVERY CIRCUIT AND DATA ERROR DETECTION CIRCUIT

(75) Inventors: Jong-Kon Bae, Seoul (KR); Kyu-Young Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 557 days.

(21) Appl. No.: 12/564,247

(22) Filed: Sep. 22, 2009

(65) Prior Publication Data

US 2010/0077281 A1 Mar. 25, 2010

(30) Foreign Application Priority Data

Sep. 25, 2008 (KR) .......................... 10-2008-0094264

(51) Int. Cl.
*H03M 13/00* (2006.01)
*H04L 1/00* (2006.01)

(52) U.S. Cl.
USPC .......................................... 714/758; 714/747

(58) Field of Classification Search
None
See application file for complete search history.

(56) References Cited

U.S. PATENT DOCUMENTS

| 3,594,736 | A | * | 7/1971 | Hoffman ....................... 365/208 |
| 5,455,542 | A | * | 10/1995 | Spence et al. ................. 331/158 |
| 5,739,728 | A | * | 4/1998 | Kim ............................. 331/111 |
| 6,191,659 | B1 | * | 2/2001 | Daanen et al. ................. 331/74 |
| 7,293,222 | B2 | * | 11/2007 | Shokrollahi et al. .......... 714/777 |
| 7,333,364 | B2 | * | 2/2008 | Yu et al. ................... 365/185.09 |
| 7,356,088 | B2 | * | 4/2008 | Anim-Appiah et al. ...... 375/265 |
| 2005/0200590 | A1 | * | 9/2005 | Kumekawa ................... 345/100 |
| 2005/0286309 | A1 | | 12/2005 | Kang et al. |

FOREIGN PATENT DOCUMENTS

| JP | 2005-257854 A | 9/2005 |
| KR | 10-0604873 A | 7/2006 |
| KR | 10-2007-0090310 A | 9/2007 |

\* cited by examiner

*Primary Examiner* — Daniel McMahon
(74) *Attorney, Agent, or Firm* — Sughrue Mion, PLLC

(57) ABSTRACT

An automatic data recovery circuit includes a register, an error detection unit and a data recovery unit. The register stores a register data including an input data and a remainder data generated by a cyclic redundancy check calculation on the input data using a predefined generation polynomial. The error detection unit performs a modular calculation on the register data stored in the register using the predefined generation polynomial to generate an error detection signal indicating whether an error is detected in the register data stored in the register. The data recovery unit recovers the input data when an error is detected in the input data based on the error detection signal and a comparison data generated by comparing the input data stored in the register with a reference voltage using a capacitor.

7 Claims, 4 Drawing Sheets

AUTOMATIC DATA RECOVERY CIRCUIT AND DATA ERROR DETECTION CIRCUIT

CROSS-REFERENCE TO RELATED APPLICATIONS

This application claims priority from Korean Patent Application No. 2008-0094264, filed on Sep. 25, 2008 in the Korean Intellectual Property Office, the contents of which are herein incorporated by reference in their entirety.

SUMMARY

Exemplary embodiments relate to a data error detection circuit and a data recovery circuit, and more particularly to a data error detection circuit that detects a data error generated by noise such as an electrostatic discharge (ESD) and a data recovery circuit that recovers the data.

Digital devices, such as a liquid crystal display (LCD) device, a digital television (TV) and a mobile communication device, generally include a memory unit to store a state information and/or a command data received from a host. The memory unit may include a register, an electrically erasable and programmable read only memory (EEPROM), etc.

The memory unit becomes more important in the digital devices as the digital devices perform various additional functions other than the original function.

The data stored in the register may be damaged due to various factors such as an electrostatic charge generated by a touch of an user, electromagnetic interference (EMI) generated by the operation of the digital devices and an instantaneously generated ESD.

When the data stored in the register are damaged due to the factors described above, driver integrated circuits (ICs) may not operate correctly since the driver ICs operate in response to the damaged data.

One or more exemplary embodiments provide an automatic data recovery circuit which recovers data changed by external noise and a comparison circuit used in the automatic data recovery circuit.

One or more exemplary embodiments provide a data error detection circuit which detects an error in the data changed by external noise.

In accordance with an aspect of one more exemplary embodiments, there is provided a comparison circuit includes a storage unit and a comparator. The storage unit includes a storage capacitor and provides a constant current to a node coupled to the storage capacitor or sinks the constant current from the node based on voltage levels of a plurality of bits data, and the storage capacitor stores the data as a storage voltage. The comparator compares a voltage level of the storage voltage with a voltage level of a reference voltage to generate a comparison data indicating a result of the comparison.

The storage unit may further include a current source that generates the constant current, a first current mirror, coupled between the current source and a power supply voltage, that provides the constant current, a first switch that selectively connects the first current mirror to the node based on the voltage level of the data, a second current mirror, coupled between the current source and a ground voltage, that sinks the constant current, and a second switch that selectively connects the second current mirror to the node based on a voltage level of an inverted version of the data.

The first switch and the second switch may be opened and closed complimentarily with respect to each other.

In accordance with exemplary embodiments of the present invention, an automatic data recovery circuit including a register, an error detection unit and a data recovery unit. The register stores a register data including an input data and a remainder data generated by performing a cyclic redundancy check (CRC) calculation on the input data using a generation polynomial. The error detection unit generates an error detection signal, indicating whether an error is detected in the register data, by performing a modular calculation on the register data using the generation polynomial. The data recovery unit recovers the input data when an error is detected in the input data based on the error detection signal and a comparison data generated by comparing the input data stored in the register with a reference voltage using a capacitor.

The error detection unit may generate the error detection signal based on whether a remainder generated by performing the modular calculation on the register data using the generation polynomial is equal to zero.

The data recovery unit may include a comparison circuit that stores the input data stored in the register into the capacitor and compares a voltage level of the capacitor with a voltage level of the reference voltage to generate the comparison data indicating a result of the comparison, a data correction unit that generates a recovery data when the error detection signal, the comparison data, and the input data stored in the register indicate that an error is detected in the input data stored in the register based on the comparison data, the recovery data indicating the input data stored in the register prior to a change time, and a recovered data selection unit that selects one of the recovery data and the register data based on a selection signal received from the data correction unit to provide the register with the selected data, and provides the register with a storage time at which the register stores the recovery data, wherein the register data stored in the register is changed by external noise at the change time.

The data correction unit may determine that the register data stored in the register is not changed, when the error detection signal corresponds to a first logic level.

The data correction unit may determine that the remainder data stored in the register is changed, when the error detection signal corresponds to a second logic level, and a voltage level of the input data stored in the register is substantially equal to a voltage level of the comparison data.

The data correction unit may determine that the input data stored in the register is changed, when the error detection signal corresponds to a second logic level, and a voltage level of the input data stored in the register is not equal to a voltage level of the comparison data.

The recovered data selection unit may select the register data when the selection signal indicates that an error is not detected in the input data stored in the register, and select the recovery data and a latch clock when the selection signal indicates that an error is detected in the input data stored in the register, the latch clock being received from the data correction unit and indicating the storage time.

In accordance with an aspect of one or more exemplary embodiments, there is provided a data error detection circuit including an encoder, a register and an error detection unit. The encoder generates a parity bit by encoding a fixed bit and data, provided from a memory in response to a command received from a host, using a generation matrix, and provides a Hamming code including the data, the fixed bit and the parity bit. The register stores the Hamming code. The error detection unit provides the memory with an error detection signal indicating whether an error is detected in data stored in the register by performing a parity check on the Hamming code stored in the register using a parity check matrix.

The fixed bit may be in a logic high level.

The data may have three bits, and the Hamming code (C), a data matrix (M) including the fixed bit, and the generation matrix (G) may be in the following relation:

C=MG wherein, C=[m0, m1, m2, m3, p4, p5, p6], M=[m0, m1, m2, m3], G=[1 0 0 0 1 1 1; 0 1 0 0 1 0 1; 0 0 1 0 1 1 0; 0 0 0 1 0 1 1], m0, m1 and m2 are the data, m3 is the fixed bit, and each of p4, p5 and p6 is the parity bit.

The data may have three bits, and the Hamming code (C) and the parity check matrix (H) may be in the following relation:

HC=O wherein, H=[1 1 1 0 1 0 0; 1 0 1 1 0 1 0; 1 1 0 1 0 0 1], C=[m0, m1, m2, m3, p4, p5, p6]$^T$, O=[0, 0, 0]$^T$, M0, m1 and m2 are the data, m3 is the fixed bit, and each of p4, p5 and p6 is the parity bit.

BRIEF DESCRIPTION OF THE DRAWINGS

Illustrative, non-limiting, exemplary embodiments will be described with reference to the accompanying drawings in which.

DETAILED DESCRIPTION OF EXEMPLARY EMBODIMENTS

Figure 1:
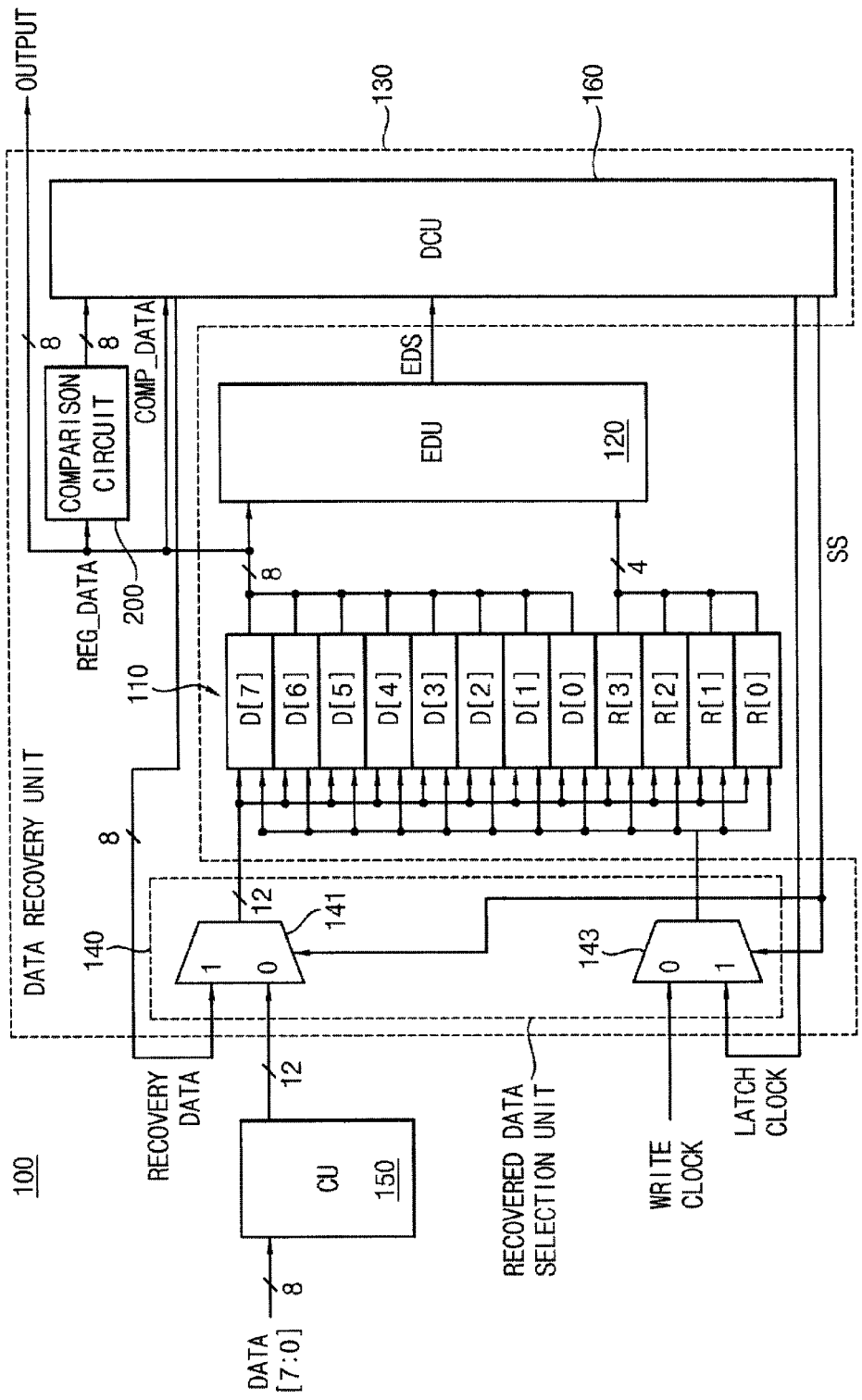
FIG. 1 is a block diagram illustrating an automatic data recovery circuit according to an exemplary embodiment.

Various exemplary embodiments will be described more fully with reference to the accompanying drawings, in which some exemplary embodiments are shown. The inventive concept may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments and is not intended to be limiting of the invention. As used herein, the singular forms "a," "an" and "the" are not intended to exclude the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an automatic data recovery circuit according to an exemplary embodiment.

In FIG. 1, it is illustrated that eight-bit input data DATA[7:0] is input to an automatic data recovery circuit 100.

Referring to FIG. 1, the automatic data recovery circuit 100 may include a register 110, an error detection unit (EDU) 120 and a data recovery unit 130. The automatic data recovery circuit 100 may further include a calculation unit (CU) 150.

The calculation unit 150 may perform a cyclic redundancy check (CRC) calculation on the input data DATA[7:0] using a predefined generation polynomial, and provide the register 110 with register data, which includes the input data DATA[7:0] and remainder data R[3:0] generated by the CRC calculation, through a recovered data selection unit 140 included in the data recovery unit 130. The register 110 may include a one or more flip-flops.

The error detection unit 120 may perform a modular calculation on the register data stored in the register 110 using the predefined generation polynomial. When the input data DATA[7:0] stored in the register 110 is not changed by external noise such as an electrostatic discharge (ESD), a remainder generated by the modular calculation equals to zero. When the input data DATA[7:0] stored in the register 110 is changed by external noise such as an ESD, the remainder generated by the modular calculation does not equal to zero.

Figure 2:
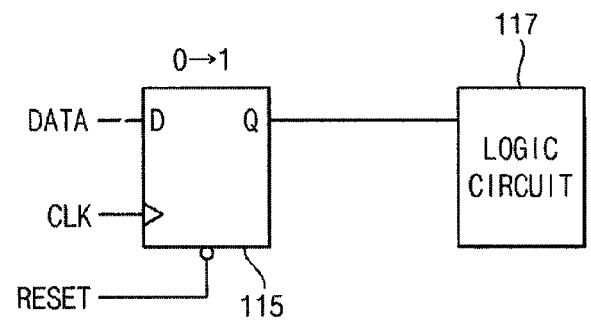
FIG. 2 is a diagram illustrating a change of a value stored in a flip-flop included in a register by an ESD.

FIG. 2 is a diagram illustrating a change of a value stored in a flip-flop 115 included in the register 110 by an ESD.

The flip-flop 115 included in the register 110 may output data stored in the flip-flop 115 to a logic circuit 117 in response to a read command. The data stored in the flip-flop 115 may be command data received from a host (not illustrated), and the stored command data may be used to determine how to operate a liquid crystal display (LCD) driving integrated circuit (IC). When the data stored in the register 110 is changed by external noise such as an ESD and an electromagnetic interference (EMI), the logic circuit 117 may not operate correctly so that an incorrect image is displayed in an LCD screen. The automatic data recovery circuit 100 of FIG. 1 may be used to prevent incorrect operation of the logic circuit 117 caused by a change of the data.

Referring again to FIG. 1, when the input data DATA[7:0] is [11100110] and the predefined generation polynomial is [11001], the calculation unit 150 may provide the register 110 with the register data [111001100110], which includes the input data DATA[7:0] and the remainder data generated by the CRC calculation, since the remainder data generated by the CRC calculation is [0110].

The error detection unit 120 may perform the modular calculation on the register data [111001100110] stored in the register 110 using the predefined generation polynomial [11001]. That is, the error detection unit 120 may perform the following calculation:

[111001100110] mod [11001].

The remainder generated by the above modular calculation equals to [0000], which indicates that the register data stored in the register 110 is not changed.

When the input data DATA[7:0] stored in the register 110 is changed, even by one bit, due to external noise such as an ESD, the remainder generated by the above modular calculation does not equal to [0000]. When the remainder generated by the above modular calculation does not equal to [0000], the error detection unit 120 may determine that an error is detected in the register data stored in the register 110. That is, the error detection unit 120 may perform the modular calculation on the register data stored in the register 110 using the predefined generation polynomial [11001], and provide a data correction unit (DCU) 160 with an error detection signal EDS based on the remainder generated by the modular calculation.

When the error detection unit 120 performs the modular calculation on the register data stored in the register 110 using the predefined generation polynomial [11001], the input data DATA[7:0] stored in the register 110 may be provided as a register storage data REG_DATA to a comparison circuit 200. The comparison circuit 200 may compare a voltage level of the register storage data REG_DATA, indicating the input data DATA[7:0] stored in the register 110, with a voltage level of a reference voltage using a capacitor, and provide the data correction unit 160 with comparison data COMP_DATA indicating the input data DATA[7:0] stored in the register prior to a change time, for example, the input data DATA[7:0] stored in the register 110 may be changed by an ESD at the change time. The comparison circuit 200 will be described with reference to FIGS. 3 and 4.

Figure 3:
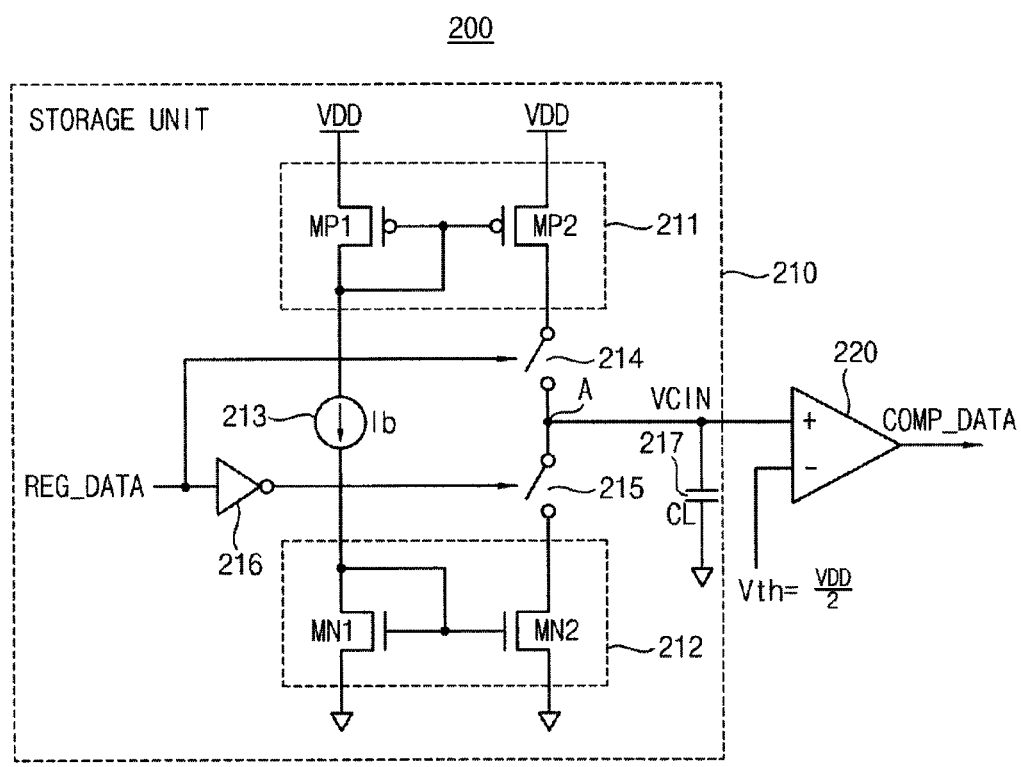
FIG. 3 is a circuit diagram illustrating a comparison circuit of FIG. 1 according to an exemplary embodiment.

FIG. 3 is a circuit diagram illustrating in further detail the comparison circuit 200 of FIG. 1.

Referring to FIG. 3, the comparison circuit 200 may include a storage unit 210 and a comparator 220. The storage unit 210 may include a first current mirror 211, a second current mirror 212, a current source 213, a first switch 214, a second switch 215 and a storage capacitor (CL) 217. The storage unit 210 may further include an inverter 216. The comparator 220 and the storage unit 210 may be connected at a node A. The first current mirror 211 may be connected to a power supply voltage VDD, the current source 213 and the first switch 214. The first current mirror 211 may include a first p-type metal oxide semiconductor (PMOS) transistor MP1 and a second PMOS transistor MP2. The second current mirror 212 may be connected to a ground voltage, the current source 213 and the second switch 215. The second current mirror 212 may include a first n-type metal oxide semiconductor (NMOS) transistor MN1 and a second NMOS transistor MN2. The current source 213 may provide a constant current Ib.

The first switch 214 may be provided with the register storage data REG_DATA, indicating the input data DATA[7: 0] stored in the register 110 of FIG. 1, and, simultaneously, the second switch 215 may be provided with an inverted version of the register storage data REG_DATA. That is, the first switch 214 and the second switch 215 may be turned on or turned off complementarily based on the voltage level of the register storage data REG_DATA. When the first switch 214 is connected to the node A, the first current mirror 211 may provide the node A with the constant current Ib. When the second switch 215 is connected to the node A, the second current mirror 212 may sink the constant current Ib from the node A to ground. Therefore, a voltage level of a storage voltage VCIN of the storage capacitor 217 may vary when the constant current Ib is provided to the node A or the constant current Ib is sunk from the node A.

The comparator 220 may compare the voltage level of the storage voltage VCIN of the storage capacitor 217 with the voltage level of the reference voltage Vth, and generate the comparison data COMP_DATA indicating a result of the comparison. The reference voltage Vth may be, for example, a half of the power supply voltage VDD. When the voltage level of the storage voltage VCIN of the storage capacitor 217 is higher than or equal to the voltage level of the reference voltage Vth, the comparator 220 may generate the comparison data COMP_DATA in a logic high level, that is, having a voltage level of the power supply voltage VDD. When the voltage level of the storage voltage VCIN of the storage capacitor 217 is lower than the voltage level of the reference voltage Vth, the comparator 220 may generate the comparison data COMP_DATA in a logic low level, that is, having a voltage level of the ground voltage. Therefore, the comparator 220 may compare each bit of the storage voltage VCIN with the reference voltage Vth to generate the comparison data COMP_DATA indicating a result of the comparison. The time for charging the storage voltage VCIN in the storage capacitor 217 or for discharging the storage voltage VCIN from the storage capacitor 217 is longer than a transition time of the voltage level of the input data DATA[7:0] stored in the flip-flop 115 included in the register 110. Exemplary embodiments of the present invention may use the difference of time for recovering data stored in the register 110 prior to a time at which the data stored in the register 110 is changed by external noise.

Figure 4:
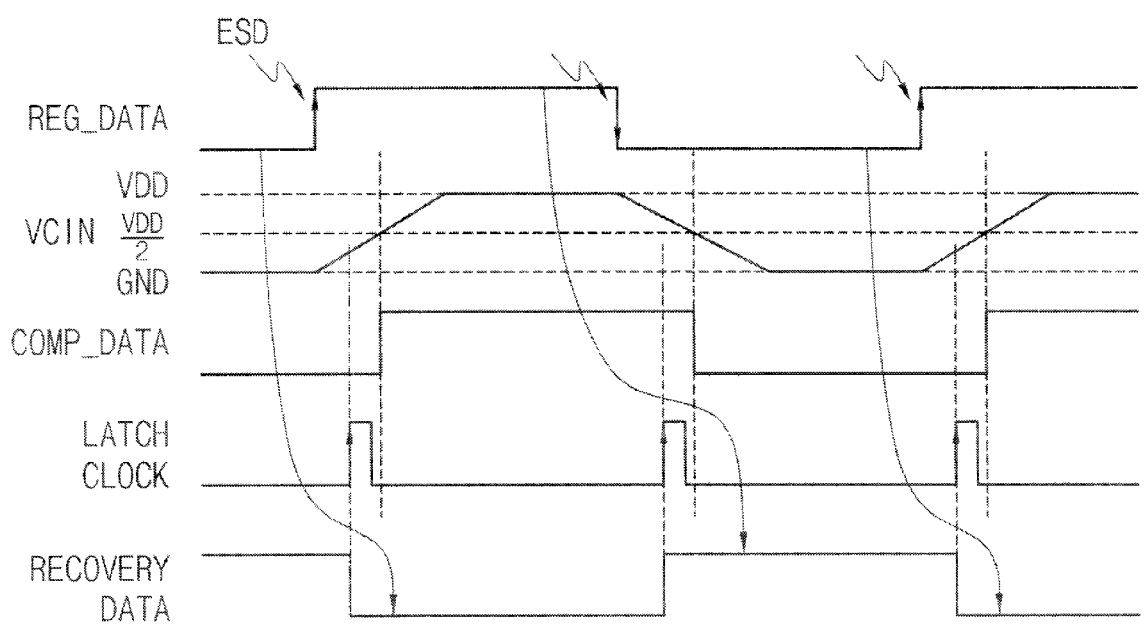
FIG. 4 is a timing diagram illustrating an operation of the comparison circuit of FIG. 3.

FIG. 4 is a timing diagram illustrating an operation of the comparison circuit of FIG. 3.

Referring to FIG. 4, the register storage data REG_DATA may be changed by external noise such as ESD.

The storage voltage VCIN stored in the storage capacitor 217 may be charged or discharged with a transient time. The comparator 220 may compare the voltage level of the storage voltage VCIN with the voltage level of the reference voltage Vth, which is a half of the power supply voltage VDD. When the voltage level of the storage voltage VCIN is higher than or equal to the voltage level of the reference voltage Vth, the comparator 220 may provide the comparison data COMP_DATA in a logic high level, and when the voltage level of the storage voltage VCIN is lower than the voltage level of the reference voltage Vth, the comparator 200 may provide the comparison data COMP_DATA in a logic low level. The data correction unit 160 of FIG. 1 may determine a logic level of the register storage data REG_DATA prior to a time at which the register storage data REG_DATA is changed by external noise based on the logic level of the comparison data COMP_DATA to generate a recovery data RECOVERY DATA.

The following Table 1 illustrates an operation of the data correction unit 160 in accordance with the error detection signal EDS.

TABLE 1

| EDS | COMP_DATA | REG_DATA | DCU OPERATION |
|---|---|---|---|
| 0 | 0 | 0 | normal operation state |
| 0 | 0 | 1 | recognizes that a new data is input into |
| 0 | 1 | 0 | the register 110 |
| 0 | 1 | 1 | normal operation state |
| 1 | 0 | 0 | keep current state since data stored in the register 110 is not changed |
| 1 | 0 | 1 | recover data by loading a value stored in |
| 1 | 1 | 0 | the storage capacitor 217 since data stored in the register 110 is changed |
| 1 | 1 | 1 | keep current state since data stored in the register 110 is not changed |

When the error detection signal EDS is in a logic low level, which indicates that the input data DATA[7:0] stored in the register 110 is not changed, the register storage data REG_DATA is provided to the logic circuit as a normal output OUTPUT, and the data correction unit 160 may generate a selection signal SS in a logic low level.

When the error detection signal EDS is in a logic high level and the voltage level of the register storage data REG_DATA is equal to the voltage level of the comparison data COMP_DATA, the data correction unit 160 may determine that the input data DATA[7:0] stored in the register 110 is not changed and the four bits other than the input data DATA[7:0] stored in the register 110 is changed, keep the current state, and generate the selection signal SS in a logic low level. When the error detection signal EDS is in a logic high level and the voltage level of the register storage data REG_DATA is not equal to the voltage level of the comparison data COMP_DATA, the data correction unit 160 may determine that the input data DATA[7:0] stored in the register 110 is changed, perform a data recovery by automatically loading a value stored in the storage capacitor 217, and generate the selection signal SS in a logic high level.

Referring again to FIG. 1, the data correction unit 160 may provide the recovery data RECOVERY DATA, a latch clock LATCH CLOCK and the selection signal SS to the recovered data selection unit 140. The recovered data selection unit 140 may include a data selection unit 141 and a clock selection unit 143. The data selection unit 141 may select one of the register data, which includes the input data DATA[7:0] and the remainder data, and the recovery data RECOVERY DATA based on a logic level of the selection signal SS. The clock selection unit 143 may select one of a write clock WRITE CLOCK and the latch clock LATCH CLOCK based on a logic level of the selection signal SS. When the selection signal SS indicates that the input data DATA[7:0] stored in the register 110 is not changed, that is, the selection signal SS is in a logic low level, the recovered data selection unit 140 may select the register data, which includes the input data DATA[7:0] and the remainder data, and the write clock WRITE CLOCK. The selected register data may be written to the register 110 in synchronization with the write clock WRITE CLOCK. When the selection signal SS indicates that the input data DATA[7:0] stored in the register 110 is changed, that is, the selection signal SS is in a logic high level, the recovered data selection unit 140 may select the recovery data RECOVERY DATA and the latch clock LATCH CLOCK. The selected recovery data RECOVERY DATA may be written to the register 110 in synchronization with the latch clock LATCH CLOCK.

Therefore, the automatic data recovery circuit 100 according to exemplary embodiments, which may be used in a display device such as an LCD device, may determine whether data is changed by external noise such as an ESD and automatically recover the data to original values.

Figure 5:
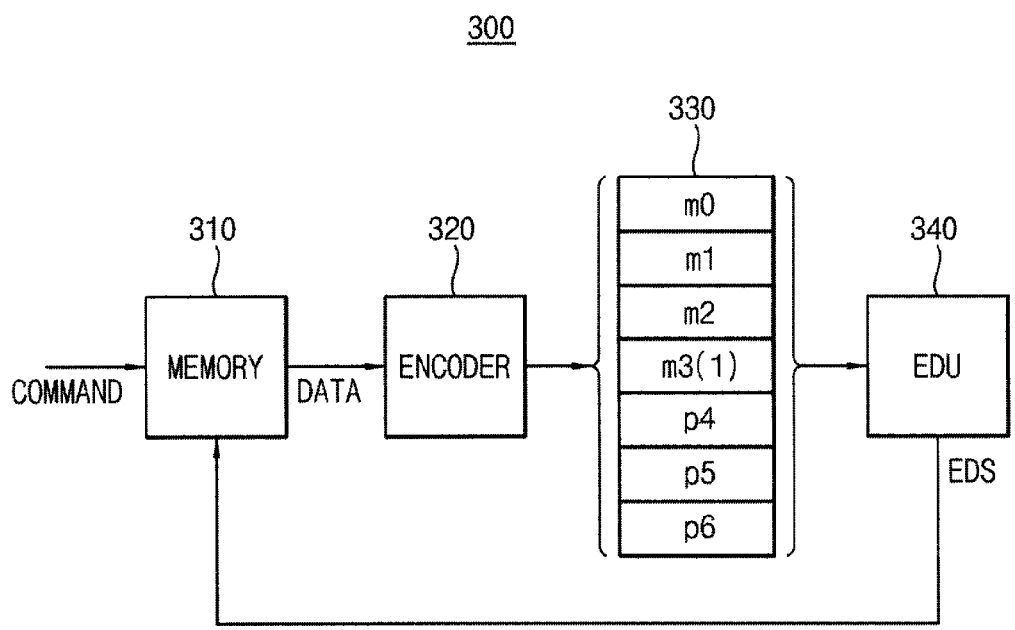
FIG. 5 is a block diagram illustrating a data error detection circuit according to an exemplary embodiment.

FIG. 5 is a block diagram illustrating a data error detection circuit according to an exemplary embodiment.

Referring to FIG. 5, the data error detection circuit 300 may include a memory 310, an encoder 320, a register 330 and an error detection unit (EDU) 340.

The memory 310 may store data such as an analog voltage setting value and a gamma correction value. The data stored in the memory 310 may be provided to the register 330 in response to a command data received from a host (not illustrated), be provided from the register 330 to a logic circuit (not illustrated), and then be provided to a driver IC of the display device such as an LCD device. The provided data may be used for operating the driver IC. However, the data stored in the register 330 may be changed due to being exposed to external noise such as an electrostatic discharge and a power bouncing. When the data stored in the register 330 is changed, the driver IC may not operate correctly. Therefore, when the data stored in the register 330 is changed, the register 330 may be provided with the data from the memory 310 again so that the driver IC of the display device operates correctly.

The memory 310 may include a non-volatile memory such as an electrically erasable and programmable read only memory (EEPROM).

The data stored in the memory 310 may be provided to the encoder 320. For purposes of explanation only, it will be assumed that the data stored in the memory 310 is three bits. However, embodiments are not limited to this exemplary number of bits. The encoder 320 may generate parity bits based on the data received from the memory 310 and a fixed bit using a generation matrix.

Figure 6:
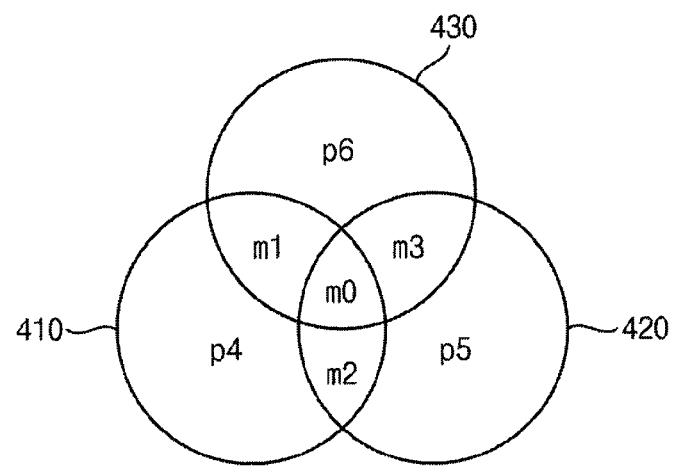
FIG. 6 is a diagram illustrating how the encoder of FIG. 5 generates parity bits based on data and a fixed bit.

FIG. 6 is a diagram illustrating how the encoder of FIG. 5 generates parity bits based on data and a fixed bit.

Referring to FIG. 6, the encoder 320 may generate the parity bits p4, p5 and p6 for the data m0, m1 and m2 received from the memory 310 and the fixed bit m3 using Equation 1 as follows such that a sum of values in each of the circles 410, 420 and 430 should be "1".

$$p4 = m0 \text{ XOR } m1 \text{ XOR } m2$$

$$p5 = m0 \text{ XOR } m2 \text{ XOR } m3$$

$$p6 = m0 \text{ XOR } m1 \text{ XOR } m3 \quad \text{Equation 1}$$

Here, the fixed bit m3 is fixed to 1. The fixed bit m3 may be stored in the encoder 320 or be provided from outside of the encoder 320. The encoder 320 may generate a Hamming code m0, m1, m2, m3, p4, p5 and p6, which includes the data m0, m1, and m2, the fixed bit m3 and the parity bits p4, p5 and p6, using Equation 2 as follows.

$$C = MG \quad \text{Equation 2}$$

Here, the Hamming code C=[m0, m1, m2, m3, p4, p5, p6], a data matrix M=[m0, m1, m2, m3], and the generation matrix G=[1 0 0 0 1 1 1; 0100101; 0010110; 0001011].

The register 330 may store the Hamming code C. Here, the register 330 may store only the data m0, m1 and m2, and the parity bits p4, p5 and p6 among the Hamming code C since, here, the fixed bit m3 is fixed to "1". That is, the fixed bit m3 may be stored in the register 330 in advance.

The error detection unit 340 may provide the memory 310 with an error detection signal EDS, which indicates an error in the data m0, m1 and m2 stored in the register 330, by performing a parity check on the Hamming code C using a parity check matrix. When the error detection signal EDS indicates that an error is detected in the data m0, m1 and m2 stored in the register 330, the data stored in the memory 310 may be loaded again.

The error detection unit 340 may detect the error using Equation 3 as follows.

m0XORm1XORm2XORp4=0 m0XORm2XORm3XORp5=0 m0XORm1XORm3XORp6=0        Equation 3

Equation 3 may be expressed as Equation 4 as follows using the parity check matrix H.

HC=O        [Equation 4]

Here, the parity check matrix H=[1 1 1 0 1 0 0; 1 0 1 1 0 1 0; 1 1 0 1 0 0 1], the Hamming code C=[m0, m1, m2, m3, p4, p5, p6]$^T$, and O=[0, 0, 0]$^T$.

When the result of Equation 4 is not 0=[0, 0, 0]$^T$, the error detection unit 340 may generate the error detection signal EDS in a logic high level since the data m0, m1 and m2 stored in the register 330 contain an error, and the data stored in the memory 310 may be loaded again.

The data error detection circuit according to exemplary embodiments may detect an error in the data stored in the register using the fixed bit, which is fixed to a logic high level, in the Hamming code. The data error detection circuit according to exemplary embodiments may detect an error even if all data stored in the register are changed, since the data error detection circuit uses the fixed bit.

As described above, the automatic data recovery circuit according to exemplary embodiments may prevent an incorrect operation of a driver IC in a display device since the automatic data recovery circuit detects an error, caused by external noise, in the data stored in the register and automatically recovers the data to provide the driver IC with the recovered data.

The foregoing is illustrative of aspects of the present inventive concept and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An automatic data recovery circuit comprising:

a register that stores a register data including input data and remainder data generated by performing a cyclic redundancy check calculation on the input data;

an error detection unit that generates an error detection signal, indicating whether an error is detected in the register data; and a data recovery unit that recovers the input data stored in the register when an error is detected in the input data stored in the register, wherein the input data is recovered based on the error detection signal and comparison data generated by comparing the input data stored in the register with a reference voltage, wherein the data recovery unit comprises:

a comparison circuit that stores the input data stored in the register into a capacitor and compares a voltage level of the capacitor with a voltage level of the reference voltage to generate the comparison data indicating a result of the comparison;

a data correction unit that generates recovery data when the error detection signal, the comparison data, and the input data stored in the register indicate that an error is detected in the input data stored in the register, the recovery data indicating the input data stored in the register prior to a change time at which the error occurred; and a recovered data selection unit that selects one of the recovery data and the register data based on a selection signal received from the data correction unit to provide the register with selected one of the recovery data and the register data, and provides the register with a storage time at which the register stores the recovery data, and wherein the register data stored in the register is changed by external noise.

2. The automatic data recovery circuit of claim 1, wherein the data recovery unit determines whether the input data stored in the register is changed as a result of a data error, and performs data recovery by loading a stored value when the input data stored in the register is determined to have changed.

3. The automatic data recovery circuit of claim 1, wherein the error detection unit generates the error detection signal based on the remainder generated by performing the modular calculation on the register data using the generation polynomial.

4. The automatic data recovery circuit of claim 1, wherein the data correction unit determines that the register data stored in the register is not changed, when the error detection signal corresponds to a first logic level.

5. The automatic data recovery circuit of claim 1, wherein the data correction unit determines that the remainder data stored in the register is changed, when the error detection signal corresponds to a second logic level, and a voltage level of the input data stored in the register is substantially equal to a voltage level of the comparison data.

6. The automatic data recovery circuit of claim 1, wherein the data correction unit determines that the input data stored in the register is changed, when the error detection signal corresponds to a second logic level, and a voltage level of the input data stored in the register is not equal to a voltage level of the comparison data.

7. The automatic data recovery circuit of claim 1, wherein the recovered data selection unit selects the register data when the selection signal indicates that an error is not detected in the input data stored in the register, and wherein the recovered data selection unit selects the recovery data and a latch clock when the selection signal indicates that an error is detected in the input data stored in the register, the latch clock being received from the data correction unit and indicating the storage time.

* * * * *